United States Patent [19]
Schlotterbeck

[11] Patent Number: 5,204,823
[45] Date of Patent: Apr. 20, 1993

[54] METHOD AND APPARATUS FOR HIGH-SPEED LAYER THICKNESS CURING IN 3-D MODEL MAKING

[75] Inventor: David L. Schlotterbeck, Anaheim, Calif.

[73] Assignee: CalComp Inc., Anaheim, Calif.

[21] Appl. No.: 673,767

[22] Filed: Mar. 20, 1991

[51] Int. Cl.$^5$ .................. G06F 15/46; B23K 26/02
[52] U.S. Cl. ..................... 364/473; 364/468; 364/477; 264/22; 264/25; 425/174.4
[58] Field of Search ............... 364/468, 473, 476, 477; 264/22, 139, 25; 425/163, 174.4, 142, 174.6

[56] References Cited

U.S. PATENT DOCUMENTS

| | | | |
|---|---|---|---|
| 5,014,207 | 5/1991 | Lawton | 364/468 |
| 5,059,266 | 10/1991 | Yamane et al. | 156/64 |
| 5,121,329 | 6/1992 | Crump | 364/468 |

*Primary Examiner*—Jerry Smith
*Assistant Examiner*—Paul Gordon
*Attorney, Agent, or Firm*—Davis, Bujold & Streck

[57] ABSTRACT

This is a method and associated apparatus for creating a 3-dimensional model by curing a photocurable liquid polymer. The method comprises first placing a quantity of the photocurable liquid polymer in a container. A substrate upon which to build the model is then placed in the container and in the polymer. A knife member is positioned over the substrate with a bottom edge parallel to the substrate at a layer-spaced distance therefrom. The knife member is then moved over the substrate and parallel thereto from a starting side edge of the model to an opposite side edge of the model while a 1-dimensional pattern of light beams for curing the liquid polymer is simultaneously created and conducted to a line at and parallel to the bottom edge of the knife member and therefrom into the liquid polymer immediately behind the bottom edge of the knife member to cure a layer of the polymer and thereby form a layer of the model. The knife member is then raised over the layer just created so as to place the bottom edge parallel to that layer at a layer-spaced distance therefrom. This process is then repeating until the model had been formed in a line-by-line and layer-by-layer pattern from a bottom layer to a top layer.

16 Claims, 5 Drawing Sheets

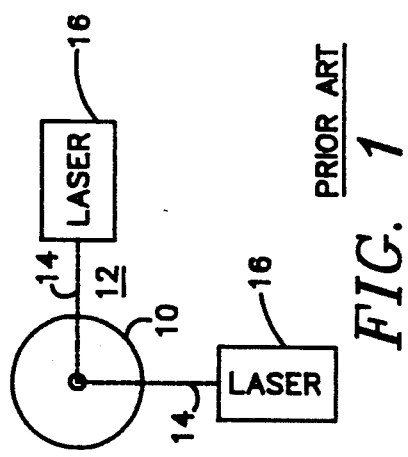
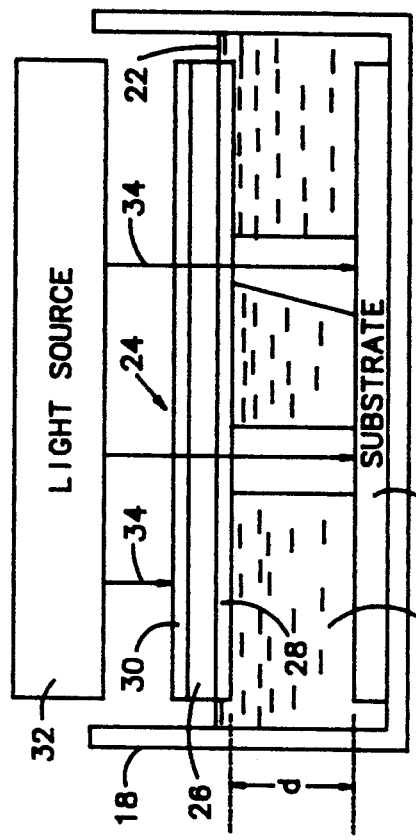
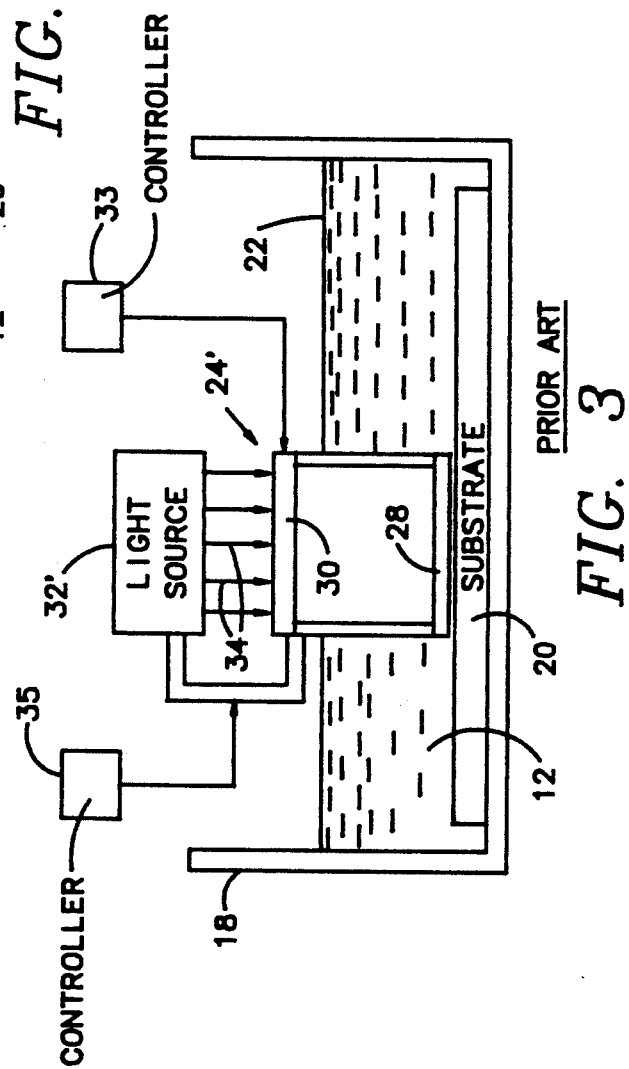

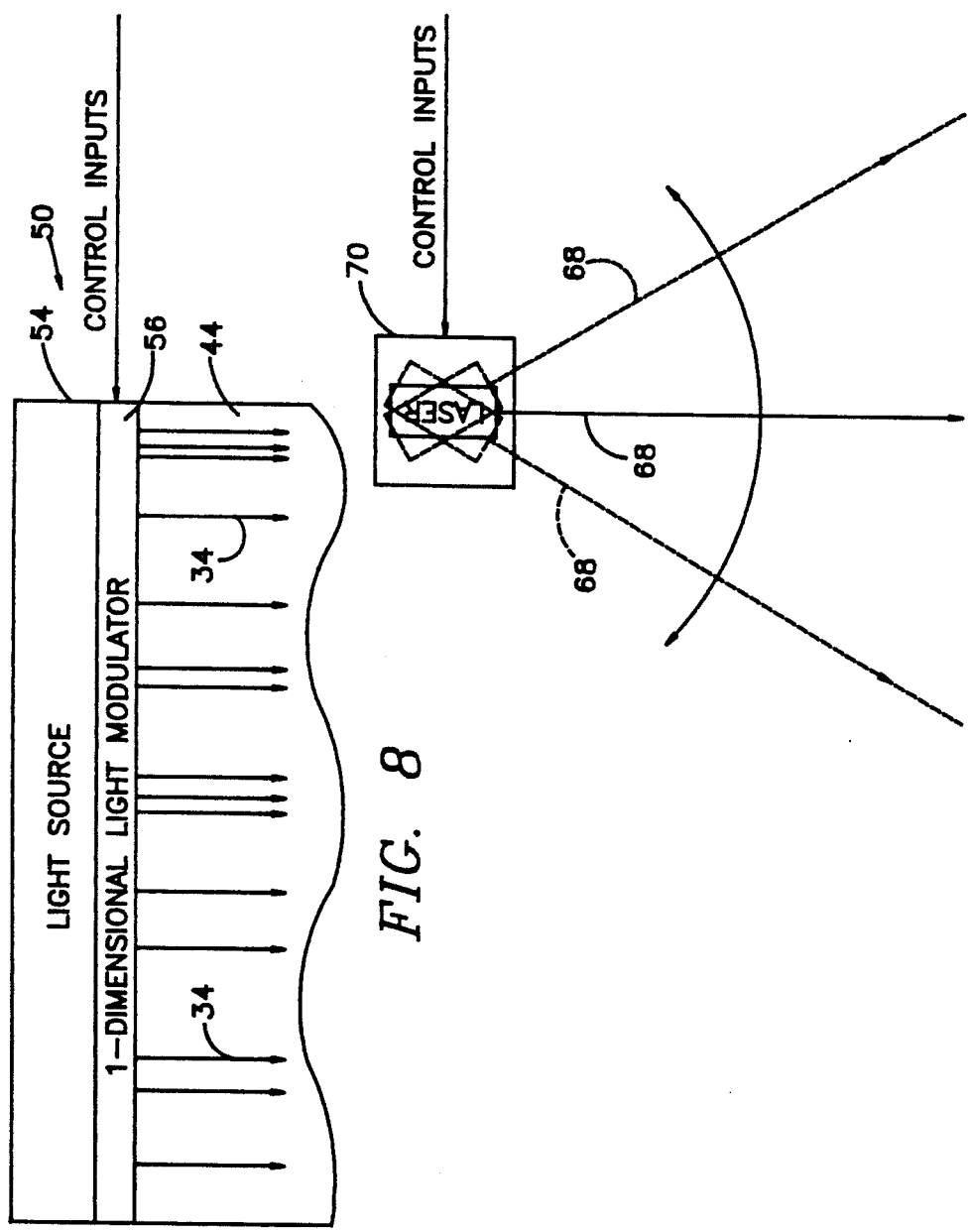

METHOD AND APPARATUS FOR HIGH-SPEED LAYER THICKNESS CURING IN 3-D MODEL MAKING

BACKGROUND OF THE INVENTION

This invention relates to 3-D model making employing photo-cured liquid polymers and, more particularly, to apparatus for curing a photocurable liquid polymer to create a 3-dimensional model comprising, a container containing the photocurable liquid polymer; a substrate upon which to build the model disposed in the container and in the polymer; a knife member disposed over the substrate with a bottom edge parallel to the substrate; movement means for moving the bottom edge of the knife member up and down with respect to the substrate and for moving the knife member over the substrate parallel thereto; curing means for creating and conducting a 1-dimensional pattern of light beams for curing the liquid polymer to a line immediately behind and parallel to the bottom edge and therefrom into the liquid polymer; and, control means connected to the movement means for repeatedly moving the knife member over the substrate parallel thereto in a series of adjacent layers and connected to the curing means for simultaneously creating and conducting a series of 1-dimensional patterns of light beams into the liquid polymer to cure the liquid polymer in a line-by-line and layer-by-layer pattern from a bottom layer to a top layer.

It is known in the art that 3-dimensional parts can be constructed by photocuring a liquid polymer in a controlled fashion. Typically, the control is accomplished by a computer. In such instances, the model-making device can be treated and considered in the manner of other computer peripheral devices. This is particularly true and applicable where the specifications for the model to be "built" are generated by a computer-resident CAD system, or the like.

One prior approach to such model making can be found in the patent of Swainson (U.S. Pat. No. 4,041,476) which is also depicted in greatly simplified form in FIG. 1. The figure or model 10 is created in-situ within the liquid polymer 12 by the controlled intersection of two laser beams 14 from laser sources 16. Each laser beam 14 has insufficient energy to cure the photocurable liquid polymer 12; but, the intersection of the two beams creates sufficient energy to cause curing thereof. Thus, by moving the intersection of the two laser beams 14 in a controlled manner through the liquid polymer 12, the model 10 can be built up point by point. As can be appreciated, however, it is hard to accurately control the intersection point due to factors such as refraction and varying distances travelled within the polymer 12.

A second approach is disclosed in two different embodiments in the two patents of Fudim (U.S. Pat. Nos. 4,752,498 and 4,801,477) which are also the subject of the simplified drawings of FIGS. 2 and 3, respectively. In Fudim's '498 approach of FIG. 2, the liquid polymer 12 is contained within a tank 18. A substrate 20 upon which the model is to be constructed is disposed in the bottom of the tank 18 and parallel to the top surface 22 of the polymer 12. A flat exposure member 24 is disposed above the substrate 20 and parallel thereto. The bottom portions 26, 28 of the exposure member 24 are transparent to the passage of photocuring light. Moreover, the lower bottom portion 28 is placed below the top surface 22 of the polymer 12 at a precise and known distance "d" from the substrate 20. The top layer of the member 24 is an exposure mask 30. A curing light source 32 of light beams 34 is disposed over the exposure mask 30. It was Fudim's intent that by changing the light-passing qualities of the mask 30, the passage of the light beams 34 therethrough could be controlled more readily than in the case of the prior art approach of FIG. 1 and, therefore, accurate models could be created.

As those skilled in the art will undoubtedly recognize, the approach of Fudim's '498 patent did fix the distance from the top of the polymer 12 to the substrate 20; but, the distance the light beams 34 travel changes as the model builds up from the bottom. Moreover, the creation of complex shapes is virtually impossible using such an approach unless a very complex mask-changing and control technique is employed. Apparently, Fudim also recognized the shortcomings of his first approach and modified it to create the apparatus and method of his '477 patent, which is shown in simplified form in FIG. 3. In this approach, the exposure member 24' and the curing light source 32' are connected together for horizontal and vertical movement by the controller 35 while the exposure mask is controlled by its own controller 33. The exposure member 24' and the curing light source 32' are also reduced in their overall horizontal dimensions and the lower bottom portion 28 is spaced well below the exposure mask 30 so as to be initially positionable just above the substrate 20. The exposure mask 30 in this embodiment is a dynamically changeable device such as a 2-dimensional liquid crystal display panel. To cure the polymer 12 and create the model, the light source 32' and exposure member 24' are moved over the surface of the substrate 20 from area to area. At each area, the exposure mask 30 is set for that portion and layer of the model being created and the light source 32' employed to cure a layer of the polymer 12. When each area of the model for one layer has been cured and created, the light source 32' and exposure member 24' are raised to the next level and the process is repeated. This whole area-by-area and layer-by-layer process is repeated until the whole model has been built.

While Fudim's '477 approach is undoubtedly better than his '498 approach and more likely to produce a useful output, those skilled in the art will readily recognize and appreciate that it is still an approach which is best left at the laboratory curiosity stage and not one upon which large-scale commercial apparatus can be based. For one, the process would be much too slow. For another, the components required would be much too complex and expensive to create in a low-cost commercial product.

Another prior art approach as employed in apparatus of a company known as 3D Systems is depicted in FIG. 4. In this case, a previously-cured base element 37 onto which additional layers are to be molded is "overdipped"; that is, the base element 37 is dipped into the uncured liquid polymer 12 to the ghosted position 37' and then brought back up to a point at which the top layer of the uncured polymer 12 is at approximately (but slightly thicker than) the desired thickness. Then, a squeegee or blade 36 is drawn across the top layer of the uncured polymer 12 to level it to the desired thickness prior to a laser beam 38 being used to irradiate and cure the layer.

Still another approach which is substantially identical in function to the above-describe approach is depicted in FIG. 5. In this DuPont approach, the previously-cured base element 37 is lowered into the liquid polymer 12 directly to approximately the desired depth. A first blade 40 is then dipped into the top of the polymer 12 and withdrawn to a point just above the top of the liquid polymer 12. Then, the first blade 40 is drawn across the top surface of the polymer 12 over the base element 37 which causes the polymer 12 which has clung to the first blade 40 to fill any pockets or voids at the top of the solution. A second blade 42 positioned behind the first blade 40 at about the top of the polymer 12 is moved across the polymer 12 in the manner of the above-described embodiment and again followed by laser irradiation.

Wherefore, it is an object of the present invention to provide a method and apparatus for the creation of 3-dimensional parts by photocuring a liquid polymer in a controlled fashion which is fast in operation.

It is another object of the present invention to provide a method and apparatus for the creation of 3-dimensional parts by photocuring a liquid polymer in a controlled fashion which employs simple components which can be produced at low cost for commercial sales.

It is still another object of the present invention to provide a method and apparatus for the creation of 3-dimensional parts by photocuring a liquid polymer in a controlled fashion which can be used to produce models with high accuracy and complex shapes.

Other objects and benefits of the present invention will become apparent from the detailed description which follows hereinafter when taken in conjunction with the drawing figures which accompany it.

SUMMARY

The foregoing objects have been achieved by the system for creating 3-dimensional models by curing a photocurable liquid polymer of the present invention comprising, a container containing the photocurable liquid polymer; a substrate upon which to build the model disposed in the container and in the polymer; a knife member disposed over the substrate with a bottom edge parallel to the substrate; movement means for moving the bottom edge of the knife member up and down with respect to the substrate and for moving the knife member over the substrate parallel thereto; curing means for creating and conducting a 1-dimensional pattern of light beams for curing the liquid polymer to a line immediately behind and parallel to the bottom edge and therefrom into the liquid polymer; movement control means connected to the movement means for repeatedly moving the knife member over the substrate parallel thereto in a series of adjacent layers; and, light control mean connected to the curing means for creating and conducting a series of 1-dimensional patterns of light beams into the liquid polymer to cure the liquid polymer as the knife member is moved over the substrate in the series of adjacent layers whereby a model is created by curing the liquid polymer in a line-by-line and layer-by-layer pattern from a bottom layer to a top layer.

In one embodiment, the knife member includes a 1-dimensional light pipe therein extending from a top edge thereof to the bottom edge and the curing means includes point-controlled, 1-dimensional light array means disposed along the top edge of the knife member for conducting individually-controlled sources of light beams into the 1-dimensional light pipe. In one version thereof, the point-controlled, 1-dimensional light array means comprises a light source with a 1-dimensional light modulator disposed between the light source and the top edge of the knife member. Preferably, the 1-dimensional light pipe extending from the top edge to the bottom edge is a self-focusing array including means for focusing light entering the top edge at the bottom edge.

In another embodiment, the curing means includes a laser source positioned to direct a modulatable laser beam into a vertical plane disposed immediately behind the knife member and extending from a top edge thereof to a point adjacent the bottom edge and scanning means for scanning the laser beam in the vertical plane along a series of adjacent 1-dimensional rows in each layer.

DESCRIPTION OF THE DRAWINGS

FIG. 1 is a simplified drawing showing a first prior art technique for producing 3-D models employing photo-cured liquid polymers.

FIG. 2 is a simplified drawing showing a second prior art technique for producing 3-D models employing photo-cured liquid polymers.

FIG. 3 is a simplified drawing showing a third prior art technique for producing 3-D models employing photo-cured liquid polymers.

FIG. 8 is a simplified front-view drawing of the curing light source employed in the embodiment of FIG. 6.

FIG. 9 is a simplified front-view drawing of the curing light source employed in the embodiment of FIG. 7.

DESCRIPTION OF THE PREFERRED EMBODIMENT

Figure 4:
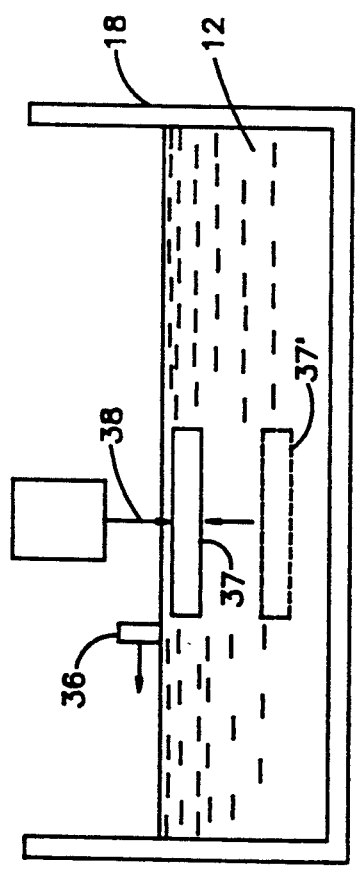
FIG. 4 is a simplified drawing showing a fourth prior art technique for producing 3-D models employing photo-cured liquid polymers.
Figure 5:
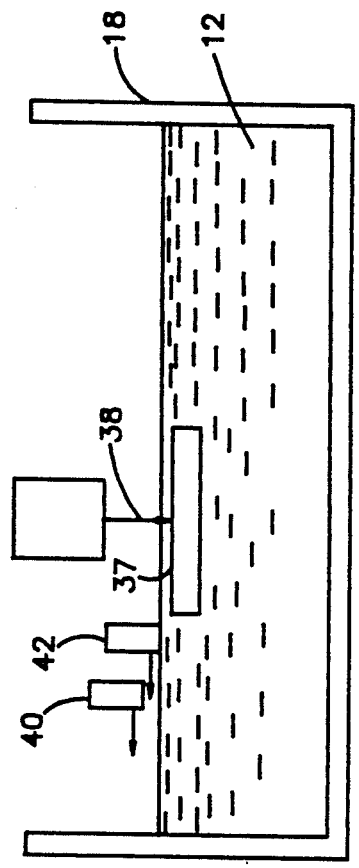
FIG. 5 is a simplified drawing showing a fifth prior art technique for producing 3-D models employing photo-cured liquid polymers.
Figure 6:
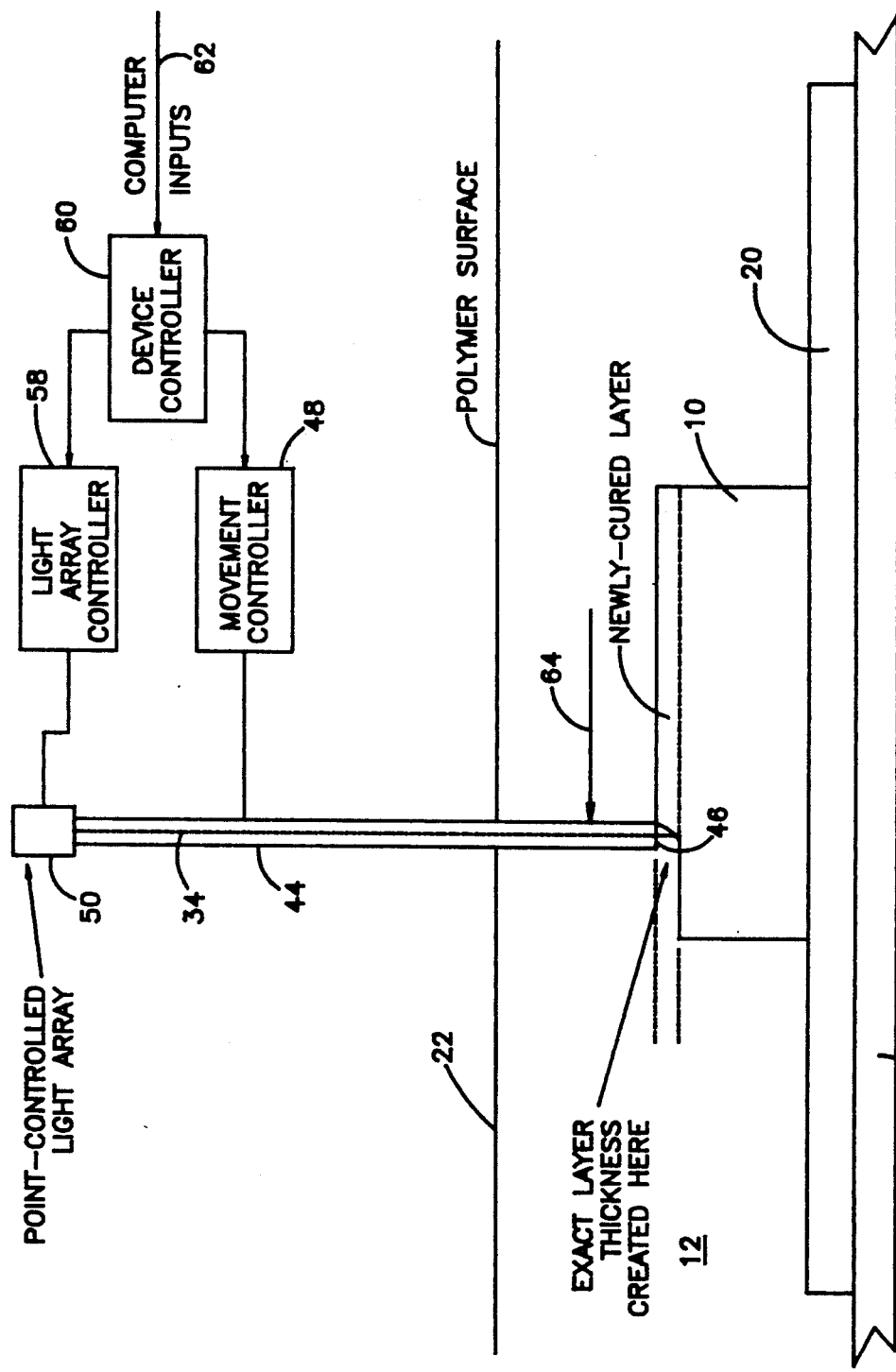
FIG. 6 is a simplified side-view drawing showing a first embodiment of apparatus for producing 3-D models employing photo-cured liquid polymers according to the present invention.

Referring first to FIGS. 6 and 8 where the present invention is shown in a first embodiment, there is a tank 18 containing a quantity of photocurable liquid polymer 12 to a depth sufficient to contain the total height of the model 10 being built. A substrate 20 upon which the model 10 is to be built is disposed horizontally on the bottom of the tank 18. A rectangular light-pipe knife 44 extends downward into the tank 18 with its bottom edge 46 parallel to the top of the substrate 20. The light-pipe knife 44 is connected to a movement controller 48 which can operate according to any of several approaches known to those skilled in the art so as to accurately move the light-pipe knife 44 horizontally over the surface of the substrate 20 (and subsequent layers of the model 10) and up and down so as to create the motion used to level and cure the polymer 12 and create the model 10 layer by layer. The light-pipe knife 44 can be made of any material which will conduct light beams to the bottom edge 46. For example, the light-pipe knife 44 might be made of vertically-oriented optic fibers bonded together with an epoxy, or the like. The light-pipe knife 44 should be in the form of a self-focusing array as is known in the art so as to accurately focus points of light at the bottom edge 46. A point-controlled light array 50 is disposed on the top of the light-pipe knife 44 to selectively insert a controlled 1-dimensional array of light beams 34 into the top of the light-pipe knife 44. Again, various approaches could be taken. As depicted, an elongated light source 54 could be placed over a 1-dimensional light modulator 56 employing liquid crystal technology, or the like. One could also employ solid-state techniques to create a 1-dimensional string of individually-addressable adjacent laser diodes as the point-controlled light array 50. Regardless of the approach used, the point-controlled light array 50 is controlled by a light array controller 58 and both the light array controller 58 and the movement controller 48 are controlled by a device controller 60 which gets its inputs at 62 from the computer (not shown) controlling the model-building process. As those skilled in the art will recognize and appreciate, if the apparatus of FIGS. 6 and 8 was built as a stand-alone device instead of as a computer peripheral device, the logic functions of the computer, the light array controller 58, the movement controller 48, and the device controller 60 could all be contained within one computational device.

In use, the movement controller 48 positions the bottom edge 46 of the light-pipe knife 44 at a starting edge of the model 10 and at an exact layer thickness above the previous layer (or the substrate 20 at the start). The light-pipe knife 44 is then moved horizontally as indicated by the arrow 64 while the point-controlled light array 50 is controlled to create a changing 1-dimensional pattern of curing light. As the light-pipe knife 44 moves forward, it pushes the polymer 12 ahead of it in front of the bottom edge 46 to create an exact layer thickness of the polymer 12 under the bottom edge 46. It is this exact layer thickness of the polymer 12 which is subjected to the curing effects of the light beams 34. This is an important part of the novelty of this invention over the prior art. The uncured polymer 12 is highly viscous and, therefore, as the bottom edge 46 of the light-pipe knife 44 moves along, it pushes the polymer 12 ahead of it and only the exact thickness desired moves into the space between the bottom edge 46 and the surface below it. As the polymer 12 is contained at this exact level, it is cured. As those skilled in the art will readily appreciate, the light-pipe knife 44 should be coated with Teflon or a similar substance to facilitate release of the solidified polymer therefrom. By employing a high-energy source for the light beams 34 and since the comprise only a 1-dimensional array, the curing process can be made much faster and the light-pipe knife 44 can be moved more quickly to generate each layer of the model 10. Moreover, it will be noted that for each layer of the model 10 (from the first to the last), the exact layer thickness of the polymer 12 under the bottom edge 46 is precisely the same. Thus, the process according to the present invention is also more exact and easier to control.

Figure 7:
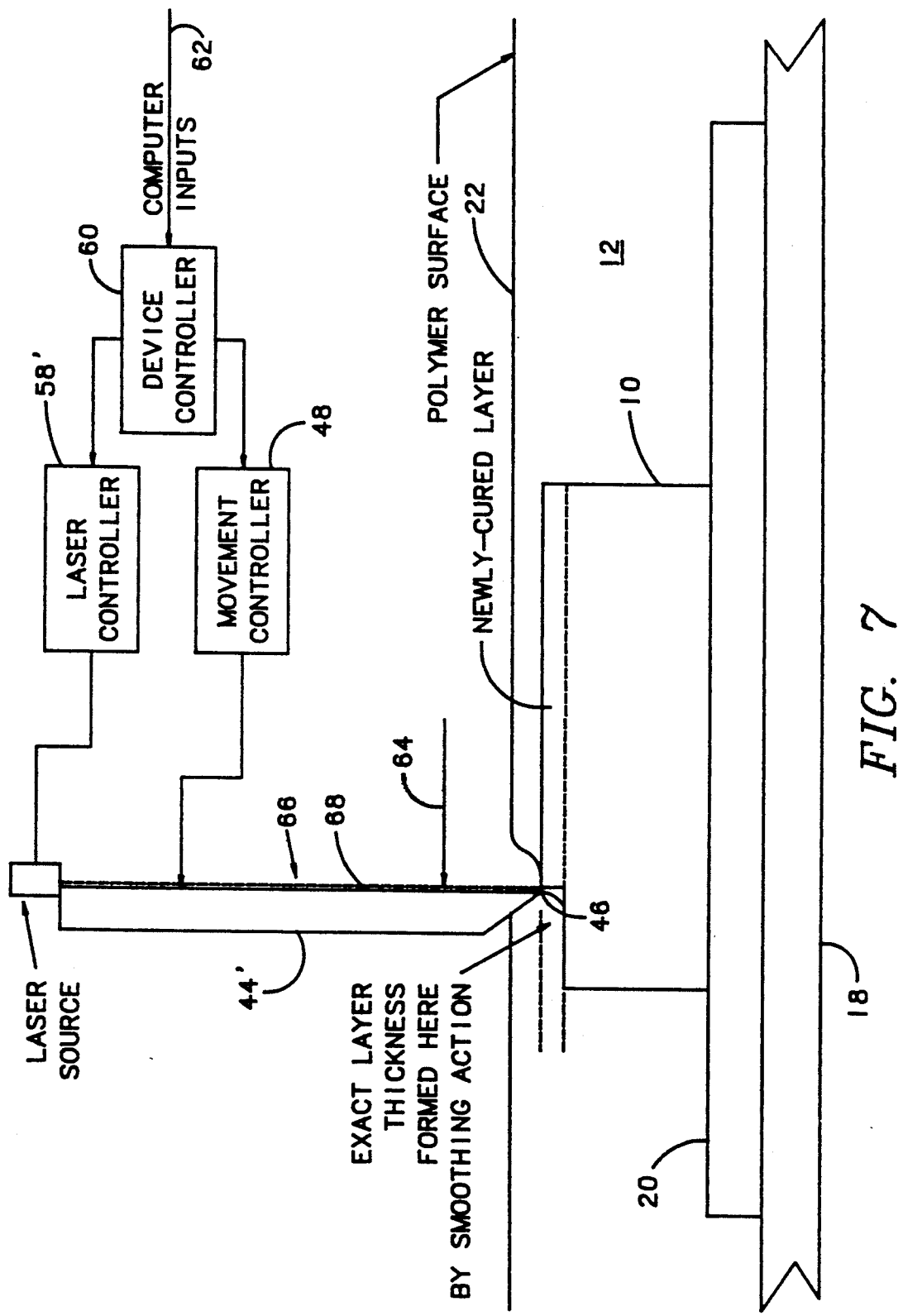
FIG. 7 is a simplified side-view drawing showing a second embodiment of apparatus for producing 3-D models employing photo-cured liquid polymers according to the present invention.

A second embodiment of the present invention is depicted in FIGS. 7 and 9. In this approach, all the components and the method of operations are virtually the same as in the above-described embodiment with one exception. The light-pipe knife 44 is replaced with a smoothing knife 44' having a vertical plane 66 through which a curing laser beam 68 scans immediately behind and parallel across the width of the smoothing knife 44'. As depicted in FIG. 7, as the smoothing knife 44' moves forward the bottom edge 46 thereof pushes the polymer 12 ahead of it and only the exact thickness desired moves into the space between the bottom edge 46 and the surface below it as in the previous embodiment. Because of its extremely high viscosity, however, as the polymer 12 emerged from behind the bottom edge 46 is cannot immediately seek a new natural level; and, before it can, it is cured by the scanning laser beam 68 from the laser source 70. In this embodiment, rather than producing a full 1-dimensional array of light beams 34 as in the case of the light-pipe knife 44, the smoothing knife 44' moves forward in a series of one-row steps. At each adjacent row of a layer, the laser source 70 is caused to move the modulated laser beam 68 from side to side immediately behind the smoothing knife 44' to create the curing 1-dimensional pattern of light for that row. In this regard, the laser source 70 could be moved physically as depicted in FIG. 9 or the laser beam 68 could be scanned using, for example, a rotating mirror head or a mirror mounted for movement by a piezoelectric device. Such approaches are well known to those skilled in the art from other devices employing scanning light beams and, per se, form no part of the novelty of this invention.

Wherefore, having thus described the present invention, what is claimed is:

1. Apparatus for curing a photocurable liquid polymer to create a 3-dimensional model comprising:
    a) a container containing the photocurable liquid polymer;
    b) a substrate upon which to build the model disposed in said container and in the polymer;
    c) a knife member disposed over said substrate with a bottom edge parallel to said substrate;
    d) movement means for moving said bottom edge of said knife member up and down with respect to said substrate and for moving said knife member over said substrate parallel thereto;
    e) curing means for creating and conducting a 1-dimensional pattern of light beams for curing the liquid polymer to a line immediately behind and parallel to said bottom edge and therefrom into the liquid polymer; and,
    f) control means connected to said movement means for repeatedly moving said knife member over said substrate parallel thereto in a series of adjacent layers and connected to said curing means for simultaneously creating and conducting a series of 1-dimensional patterns of light beams into the liquid polymer to cure the liquid polymer in a line-by-line and layer-by-layer pattern from a bottom layer to a top layer.

2. The apparatus for curing a photocurable liquid polymer to create a 3-dimensional model of claim 1 wherein:
    a) said knife member includes a 1-dimensional light pipe therein extending from a top edge thereof to said bottom edge; and,
    b) said curing means includes point-controlled, 1-dimensional light array means disposed along said top edge of said knife member for conducting individually-controlled sources of light beams into said 1-dimensional light pipe.

3. The apparatus for curing a photocurable liquid polymer to create a 3-dimensional model of claim 2 wherein:
    said point-controlled, 1-dimensional light array means comprises a light source with a 1-dimensional light modulator disposed between said light source and said top edge of said knife member.

4. The apparatus for curing a photocurable liquid polymer to create a 3-dimensional model of claim 1 wherein:
said 1-dimensional light pipe extending from said top edge to said bottom edge is a self-focusing array including means for focusing light entering said top edge at said bottom edge.

5. The apparatus for curing a photocurable liquid polymer to create a 3-dimensional model of claim 1 wherein:
said curing means includes a laser source positioned to direct a modulatable laser beam into a vertical plane disposed immediately behind said knife member and extending from a top edge thereof to a point adjacent said bottom edge and scanning means for scanning said laser beam in said vertical plane along a series of adjacent 1-dimensional rows in each layer.

6. A method of creating a 3-dimensional model by curing a photocurable liquid polymer comprising the steps of:
a) placing a quantity of the photocurable liquid polymer in a container;
b) disposing a substrate upon which to build the model in the container and in the polymer;
c) disposing a knife member over the substrate with a bottom edge parallel to the substrate at a layer-spaced distance therefrom;
d) moving the knife member over the substrate and parallel thereto from a starting side edge of the model to an opposite side edge of the model while simultaneously creating and conducting a 1-dimensional pattern of light beams for curing the liquid polymer to a line at and parallel to the bottom edge and therefrom into the liquid polymer immediately behind the bottom edge to cure a layer of the polymer and thereby form a layer of the model;
e) raising the knife member over the layer created in step (d) to place the bottom edge parallel to that layer at a layer-spaced distance therefrom; and,
f) repeating steps (d) and (e) until the model had been formed in a line-by-line and layer-by-layer pattern from a bottom layer to a top layer.

7. A system for creating 3-dimensional models by curing a photocurable liquid polymer comprising:
a) a container containing the photocurable liquid polymer;
b) a substrate upon which to build the model disposed in said container and in the polymer;
c) a knife member disposed over said substrate with a bottom edge parallel to said substrate;
d) movement means for moving said bottom edge of said knife member up and down with respect to said substrate and for moving said knife member over said substrate parallel thereto;
e) curing means for creating and conducting a 1-dimensional pattern of light beams for curing the liquid polymer to a line immediately behind and parallel to said bottom edge and therefrom into the liquid polymer;
f) movement control means connected to said movement means for repeatedly moving said knife member over said substrate parallel thereto in a series of adjacent layers; and,
g) light control mean connected to said curing means for creating and conducting a series of 1-dimensional patterns of light beams into the liquid polymer to cure the liquid polymer as said knife member is moved over said substrate in said series of adjacent layers whereby a model is created by curing the liquid polymer in a line-by-line and layer-by-layer pattern from a bottom layer to a top layer.

8. The system of claim 7 wherein:
a) said knife member includes a 1-dimensional light pipe therein extending from a top edge thereof to said bottom edge; and,
b) said curing means includes point-controlled, 1-dimensional light array means disposed along said top edge of said knife member for conducting individually-controlled sources of light beams into said 1-dimensional light pipe.

9. The system of claim 8 wherein:
said point-controlled, 1-dimensional light array means comprises a light source with a 1-dimensional light modulator disposed between said light source and said top edge of said knife member.

10. The system of claim 8 wherein:
said 1-dimensional light pipe extending from said top edge to said bottom edge is a self-focusing array including means for focusing light entering said top edge at said bottom edge.

11. The system of claim 7 wherein:
said curing means includes a laser source positioned to direct a modulatable laser beam into a vertical plane disposed immediately behind said knife member and extending from a top edge thereof to a point adjacent said bottom edge and scanning means for scanning said laser beam in said vertical plane along a series of adjacent 1-dimensional rows in each layer.

12. Peripheral apparatus for connection to a computer for creating 3-dimensional models by curing a photocurable liquid polymer in response to input commands from the computer comprising:
a) a container containing the photocurable liquid polymer;
b) a substrate upon which to build the model disposed in said container and in the polymer;
c) a knife member disposed over said substrate with a bottom edge parallel to said substrate;
d) movement means for moving said bottom edge of said knife member up and down with respect to said substrate and for moving said knife member over said substrate parallel thereto;
e) curing means for creating and conducting a 1-dimensional pattern of light beams for curing the liquid polymer to a line immediately behind and parallel to said bottom edge and therefrom into the liquid polymer;
f) movement control means connected to said movement means for moving said knife member over said substrate parallel thereto and up and down with respect to said substrate;
g) light control mean connected to said curing means for creating and conducting a 1-dimensional pattern of light beams into the liquid polymer to cure the liquid polymer; and,
h) device control means connected to said movement means and said light control means and having input means for receiving control information from the computer for repeatedly moving said knife member over said substrate parallel thereto in a series of adjacent layers and for simultaneously inputting a series of 1-dimensional patterns of light beams into the liquid polymer as said knife member is moved over said substrate in said series of adjacent layers whereby a model is created by curing the liquid polymer in a line-by-line and layer-by-layer pattern from a bottom layer to a top layer according to information from the computer.

13. The computer peripheral apparatus of claim 12 wherein:
  a) said knife member includes a 1-dimensional light pipe therein extending from a top edge thereof to said bottom edge; and,
  b) said curing means includes point-controlled, 1-dimensional light array means disposed along said top edge of said knife member for conducting individually-controlled sources of light beams into said 1-dimensional light pipe.

14. The computer peripheral apparatus of claim 13 wherein: said point-controlled, 1-dimensional light array means comprises a light source with a 1-dimensional light modulator disposed between said light source and said top edge of said knife member.

15. The computer peripheral apparatus of claim 13 wherein: said 1-dimensional light pipe extending from said top edge to said bottom edge is a self-focusing array including means for focusing light entering said top edge at said bottom edge.

16. The computer peripheral apparatus of claim 12 wherein: said curing means includes a laser source positioned to direct a modulatable laser beam into a vertical plane disposed immediately behind said knife member and extending from a top edge thereof to a point adjacent said bottom edge and scanning means for scanning said laser beam in said vertical plane along a series of adjacent 1-dimensional rows in each layer.

* * * * *